(12) United States Patent
Sutardja

(10) Patent No.: US 6,911,724 B1
(45) Date of Patent: Jun. 28, 2005

(54) INTEGRATED CHIP PACKAGE HAVING INTERMEDIATE SUBSTRATE WITH CAPACITOR

(75) Inventor: Sehat Sutardja, Cupertino, CA (US)

(73) Assignee: Marvell International Ltd., Hamilton (BE)

( * ) Notice: Subject to any disclaimer, the term of this patent is extended or adjusted under 35 U.S.C. 154(b) by 0 days.

(21) Appl. No.: 10/346,771

(22) Filed: Jan. 16, 2003

Related U.S. Application Data

(62) Division of application No. 09/966,914, filed on Sep. 27, 2001.

(51) Int. Cl.[7] .......................... H01L 23/24; H01L 23/02; H01L 25/065

(52) U.S. Cl. .............. 257/686; 257/777; 257/723; 257/728; 257/725; 257/778; 257/685; 257/737; 257/738; 257/712; 257/704; 257/710; 257/717; 257/720; 257/532; 257/528; 257/724

(58) Field of Search ............................. 257/686, 685, 257/723, 777, 778, 737, 738, 734, 712, 704, 710, 717, 720, 532, 724, 728, 725, 528

(56) References Cited

U.S. PATENT DOCUMENTS

| 5,204,809 A | | 4/1993 | Andresen | |
|---|---|---|---|---|
| 5,311,402 A | * | 5/1994 | Kobayashi et al. | 361/760 |
| 5,355,283 A | | 10/1994 | Marrs et al. | |
| 5,424,573 A | * | 6/1995 | Kato et al. | 257/431 |
| 5,495,398 A | | 2/1996 | Takiar et al. | |
| 5,550,408 A | | 8/1996 | Kunitomo et al. | |
| 5,646,828 A | | 7/1997 | Degani et al. | |

(Continued)

FOREIGN PATENT DOCUMENTS

| DE | 19821916 A1 | | 3/1999 | |
|---|---|---|---|---|
| JP | 60-154648 | * | 8/1985 | |
| JP | 62-281435 | * | 12/1987 | |
| JP | 1-248543 | * | 10/1989 | 257/675 |
| JP | 08-250652 | * | 2/1996 | |
| JP | 2001-102475 | * | 4/2001 | |

OTHER PUBLICATIONS

Bober et al., "Curent Trends in Flip–Chip Bonding Technique for Multichip Modules—especially Mirco–Jet Printing," Inst. Of Microsystem Tech., Wroclaw U. of Tech., Wroclaw, Poland, Conference 2000, pp. 1–14, via iMaps.
Amkor Technology, www.amkor.com, Advanced package glossary, pp. 1–4, Mar. 2001.

*Primary Examiner*—Alexander Oscar Williams

(57) ABSTRACT

The present integrated chip package provides a low cost package that is suitable for high density semiconductors that have high power dissipation. The integrated chip package includes at least one semiconductor chip having a first surface and a second surface. The first surface of the semiconductor chip is electrically coupled to an intermediate substrate via conductive bumps. The intermediate substrate is also electrically coupled to a package substrate via a plurality of bonding wires. The second surface of the semiconductor chip is thermally coupled to a heat sink to increase the power dissipation capacity of the integrated chip package.

38 Claims, 3 Drawing Sheets

U.S. PATENT DOCUMENTS

| | | | |
|---|---|---|---|
| 5,729,050 A | 3/1998 | Kim | |
| 5,729,440 A | 3/1998 | Jimarez et al. | |
| 5,869,894 A | 2/1999 | Degani et al. | |
| 5,959,348 A | 9/1999 | Chang et al. | |
| 6,020,646 A | 2/2000 | Boyle et al. | |
| 6,052,287 A | 4/2000 | Palmer et al. | |
| 6,069,023 A | 5/2000 | Bernier et al. | |
| 6,096,981 A | 8/2000 | Vinciarelli et al. | |
| 6,098,278 A | 8/2000 | Vindasius et al. | |
| 6,150,724 A | 11/2000 | Wenzel et al. | |
| 6,175,158 B1 | 1/2001 | Degani et al. | |
| 6,232,661 B1 | 5/2001 | Amagai et al. | |
| 6,242,815 B1 | 6/2001 | Hsu et al. | |
| 6,271,079 B1 | 8/2001 | Wei et al. | |
| 6,274,214 B1 | 8/2001 | Chan et al. | |
| 6,282,100 B1 | 8/2001 | Degani et al. | |
| 6,362,986 B1 | 3/2002 | Schultz et al. | |
| 6,388,207 B1 * | 5/2002 | Figueroa et al. | 174/262 |
| 6,421,473 B1 * | 7/2002 | Paniccia et al. | 385/14 |
| 6,424,033 B1 * | 7/2002 | Akram | 257/718 |
| 6,507,107 B2 * | 1/2003 | Vaiyapuri | 257/723 |
| 6,507,115 B1 * | 1/2003 | Hofstee et al. | 257/777 |
| 6,525,414 B2 * | 2/2003 | Shiraishi et al. | 257/686 |
| 6,535,398 B1 * | 3/2003 | Moresco | 361/792 |
| 2001/0003375 A1 | 6/2001 | Kovats et al. | |
| 2002/0071256 A1 * | 6/2002 | Figueroa et al. | 361/763 |
| 2002/0175421 A1 | 11/2002 | Kimura | |
| 2002/0195270 A1 * | 12/2002 | Okubora et al. | 174/260 |
| 2002/0195700 A1 * | 12/2002 | Li | 257/700 |
| 2002/0196898 A1 * | 12/2002 | Kameshima | 378/98.8 |
| 2003/0016133 A1 * | 1/2003 | Egbert | 340/572.7 |
| 2003/0021568 A1 * | 1/2003 | Samara-Rubio et al. | 385/132 |
| 2003/0042589 A1 * | 3/2003 | Hong | 257/686 |
| 2003/0080400 A1 * | 5/2003 | Okamoto et al. | 257/678 |

\* cited by examiner

_US 6,911,724 B1_

INTEGRATED CHIP PACKAGE HAVING INTERMEDIATE SUBSTRATE WITH CAPACITOR

CROSS-REFERENCE TO RELATED APPLICATIONS

This application is a divisional application of application Ser. No. 09/966,914, filed Sep. 27, 2001, the entire contents of which are herein incorporated by reference.

TECHNICAL FIELD

The present invention relates to integrated circuit packaging, and more particularly to packaging of flip chip semiconductors.

BACKGROUND

The drive to higher semiconductor device densities places increased demands on the packaging for these devices to remove heat generated from dissipated power in the device. One low cost packaging technique that has been used device having lower densities is plastic ball gate array (PBGA). In a PBGA thermal vias on the underside of the encapsulated die provide a thermal path for the thermal energy to the circuit board. Typically, a PBGA is limited to dissipating less than approximately 2.5 watts. The low power dissipation capability of a PBGA is quickly being exceeded by the power requirements of today's high density devices. In addition, routing the thermal energy into the circuit board limits the number of semiconductor devices that can be mounted on the circuit board.

Flip chip ball gate array (FCBGA) is a packaging technique that is capable of supporting semiconductor devices that dissipate more than 20 watts of power. In a FCBGA, the semiconductor device or integrated circuit chip is connected to a package substrate via solder balls. The package substrate is coupled to the circuit board through solder balls on the underside of the package. To connect the pads of the device or chip to the solder balls, the package substrate typically uses a build-up construction to permit the use of extremely fine pitch wiring for the interconnection. Although a FCBGA provides a packaging solution for high dissipation devices, the cost of a FCBGA is very high due to the need for a substrate having a build-up construction.

SUMMARY

The present integrated chip package provides a low cost package that is suitable for high density semiconductors that have high power dissipation. The integrated chip package includes at least one semiconductor chip having a first surface and a second surface. The first surface of the semiconductor chip is electrically coupled to an intermediate substrate via conductive bumps. The intermediate substrate is also electrically coupled to a package substrate via a plurality of bonding wires. The second surface of the semiconductor chip is thermally coupled to a heat sink to increase the power dissipation capacity of the integrated chip package.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
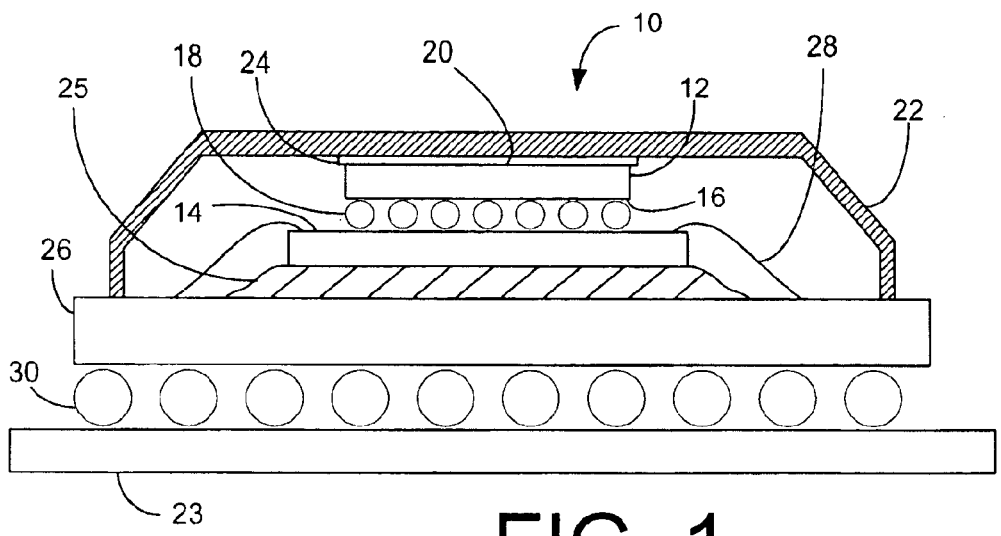
FIG. 1 shows a first embodiment of an integrated chip package in accordance with the principles of the invention.

Referring to FIG. 1, a first embodiment of an integrated chip package 10 in accordance with the principles of the invention is shown. The integrated chip package 10 is a modified FCBGA that can advantageously dissipate approximately the same amount of heat as a flip chip package at a much lower cost. In addition, the thermal path of the integrated chip package 10 extends away from the circuit board to reduce the heat load on the circuit board.

The integrated chip package 10 includes a semiconductor chip 12 configured for flip chip mounting that is attached to an intermediate substrate 14. A first surface 16 of the semiconductor chip 12 is electrically connected to the intermediate substrate 14 via conductive bumps 18. The conductive bumps 18 may be formed from any electrically conductive material such as Pb/Sn solder, Au, Ag, alloys of Au and Ag, and metallic coated polymeric studs. In addition, an epoxy 13 or other suitable material formed between the conductive bumps 18 may be used as an embedding material for the conductive bumps 18 to provide mechanical support and moisture protection. The semiconductor chip 12 may be attached to the intermediate substrate 14 using any flip chip compatible bonding method such as thermocompression, soldering, encapsulation, and adhesives.

The other surface 20 of the semiconductor chip 12 is attached to a heat sink 22 for coupling heat away from the semiconductor chip 12. The heat sink 22 may be made of any thermally conductive material such as copper and thermally conductive plastic. The semiconductor chip 12 may be attached to the heat sink 22 by any attachment item 24 that does not thermally isolate the semiconductor chip 12 such as adhesive, solder, and press-fitting by applying a mechanical force to the first surface of the semiconductor chip 12 or the intermediate substrate 14. For example, a thermally conductive epoxy may be used as the attachment item 24.

The intermediate substrate 14 is electrically connected to conductors on a package substrate 26 via several bonding wires 28. The intermediate substrate 14 converts flip chip mounting of the semiconductor chip 12 into wire bond mounting to combine and exceed the advantages of FCBGA and PBGA. Similar to FCBGA, the integrated chip package 10 provides a low resistance thermal path for heat generated in the semiconductor chip 12 so that power dissipation exceeding 20 watts may be accommodated. In addition, the thermal path of the integrated chip package 10 extends to the heat sink 22, away from the package substrate 26, thereby reducing the heat load of the circuit board or circuit substrate to which the integrated chip package 10 is connected. Also, the integrated chip package may employ a substrate that is as inexpensive as substrates used for PBGA packages. Additionally, using the intermediate substrate 14 reduces the wiring pitch requirements on bonding wire equipment used for attaching the bonding wires 28.

Figure 2:
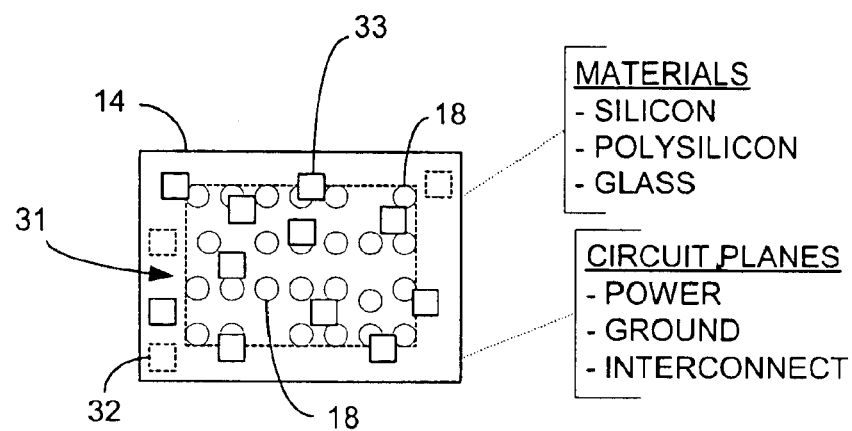
FIG. 2 shows a shows a second embodiment of an integrated chip package in accordance with the principles of the invention.

Referring to FIGS. 1 and 2, the intermediate substrate 14 may be made from any substrate material such as normal silicon wafer (either low or high quality), polysilicon, and glass. Circuit planes such as power planes, ground planes, and interconnect planes may be added to the intermediate substrate 14. The process technology used for the circuit planes is not limited to the technology used for the semiconductor chip 12. Instead, other process technologies including lower cost technologies such as 1 micron technology may be employed to reduce the cost of the package 10. The circuit planes may provide interconnect within the semiconductor chip 12 as well as to the package substrate 26 through the bonding wires 28. Including circuit planes in the intermediate substrate 14 may reduce the requirement for expensive power and ground grids on the semiconductor chip. For example, at 0.13 um, each layer of metalization costs about 10 times more than the cost of providing the same function on the intermediate substrate 14. Moreover, the semiconductor chip 12 may employ distributed power and ground conductive bumps to achieve substantially lower impedance. Decoupling capacitors 32 may be included on the intermediate substrate to provide local filtering of power and ground signals. Providing local filtering is particularly advantageous in view of the high DC and AC currents that may flow between the intermediate substrate 14 and the semiconductor chip 12. For example, in a 20 watt device operated with 1 volt supply voltage, the DC current is 20 amps with an AC current that may be 150 amps. In view of such high magnitude AC currents, providing local filtering with low inductance paths is crucial to maintain a relatively constant supply voltage. The decoupling capacitors 32 may include one or more small capacitors as well as a single large parallel plate capacitor 31 covering the whole substrate. The values of the capacitors may be controlled by varying the thickness and area of the dielectric. For example, the value of a parallel plate capacitor 31 may be controlled by varying the thickness of a layer of silicon between the metallized plates. Additional capacitor materials may be used that otherwise are generally not used in advanced wafer fabrication because of concerns with contaminating the wafer. Examples of capacitor materials include standard oxides and nitride oxides. In addition, trench capacitors 33 may be formed on the intermediate substrate 14. Trench capacitors advantageously provide higher volumetric efficiency than parallel plate capacitors. Practically one entire side of the intermediate substrate 14 may be used for decoupling capacitors 32, as well as portions of the other side of the intermediate substrate 14.

The package substrate 26 may be made of any substrate material suitable for ball grid array mounting to a device such as a circuit board or substrate. Additionally, a support layer 25 such as an epoxy or other suitable material may be inserted between the intermediate substrate 14 and the package 26 to provide addition mechanical support.

Figure 3A:
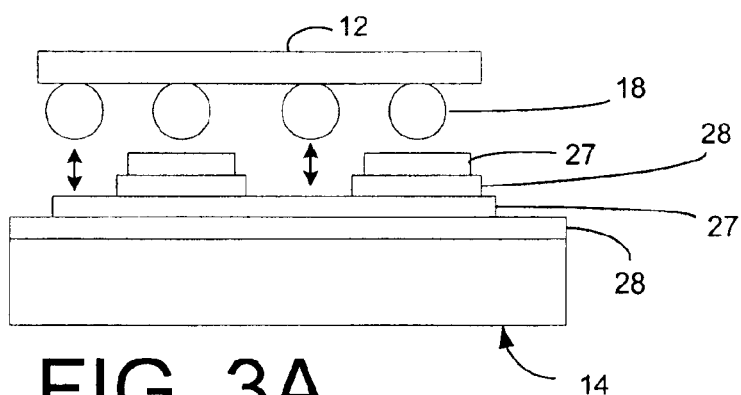
FIG. 3A shows an interface of an intermediate substrate to a semiconductor chip.

Shown in FIG. 3A is an expanded view of the interface of the intermediate substrate 14 to the semiconductor chip 12 via the conductive bumps 18. The intermediate substrate 14 may include several metalization layers 27 separated by insulation layers 28. The conductive bumps 18 are aligned with the metalization layers 27 to provide an electrical connection between the intermediate substrate 14 and the semiconductor chip 12. The metalization layers 27 and insulation layers 28 may be configured to form local decoupling capacitors.

Figure 3B:
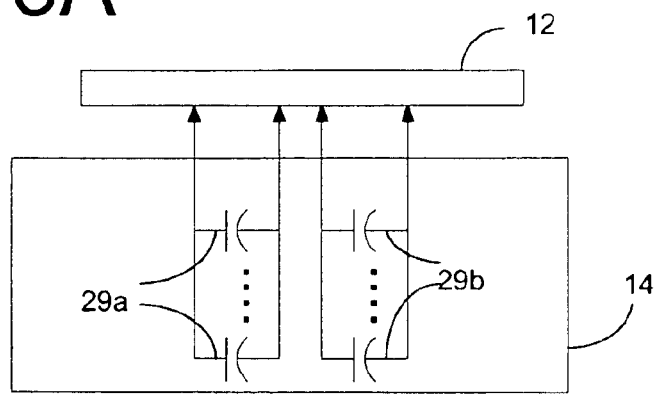
FIG. 3B shows an equivalent circuit diagram of an interface of an intermediate substrate to a semiconductor chip.

Shown in FIG. 3B is a circuit diagram illustrating the interface shown in FIG. 3A. Capacitors 29a and 29b represent the capacitance formed between the metalization layers 27.

Figure 4:
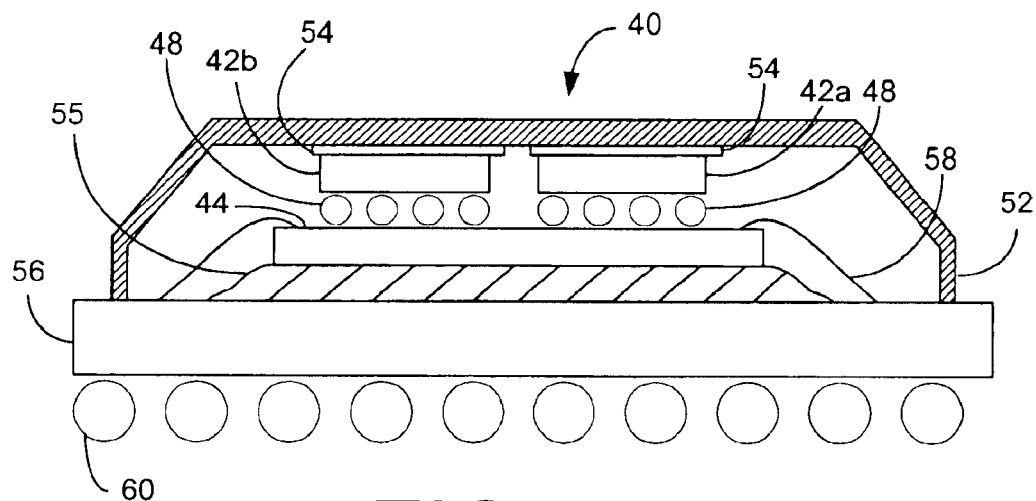
FIG. 4 shows an embodiment of an intermediate substrate.

Shown in FIG. 4 is a second embodiment of an integrated chip package 40 in accordance with the principles of the invention is shown. The integrated chip package 40 is similar in function to the integrated chip package 10, with corresponding elements numbered in the range 40–60, except that the integrated chip package 40 includes several semiconductor chips 42a and 42b attached to each intermediate substrate 44 to form a multichip module (MCM). In this embodiment, semiconductor chip 42a may be a logic circuit and semiconductor chip 42b may be a power device. Any combination of semiconductor chips 42 may be used including all logic devices. In addition, the quantity of semiconductor chips that may be mounted within the integrated chip package 40 is not limited to merely two. The intermediate substrate 44 may be used to provide interconnects within the semiconductor chips 42a and 42b, among the semiconductor chips 42a and 42b, and from the semiconductor chips 42a and 42b to the conductive bumps 60. Thousands of bonding wires may be provided between the intermediate substrate 14 and the package substrate 56 for very low cost. Since many of the interconnects between the semiconductor chips 42a and 42b are made on the intermediate substrate 44, the quantity of bonding wire interconnects within the integrated chip package 40 may be significantly reduced. This is particularly advantageous with system on a package (SOP), where the power dissipation of devices within the package 40 exceeds 20 watts.

Figure 5:
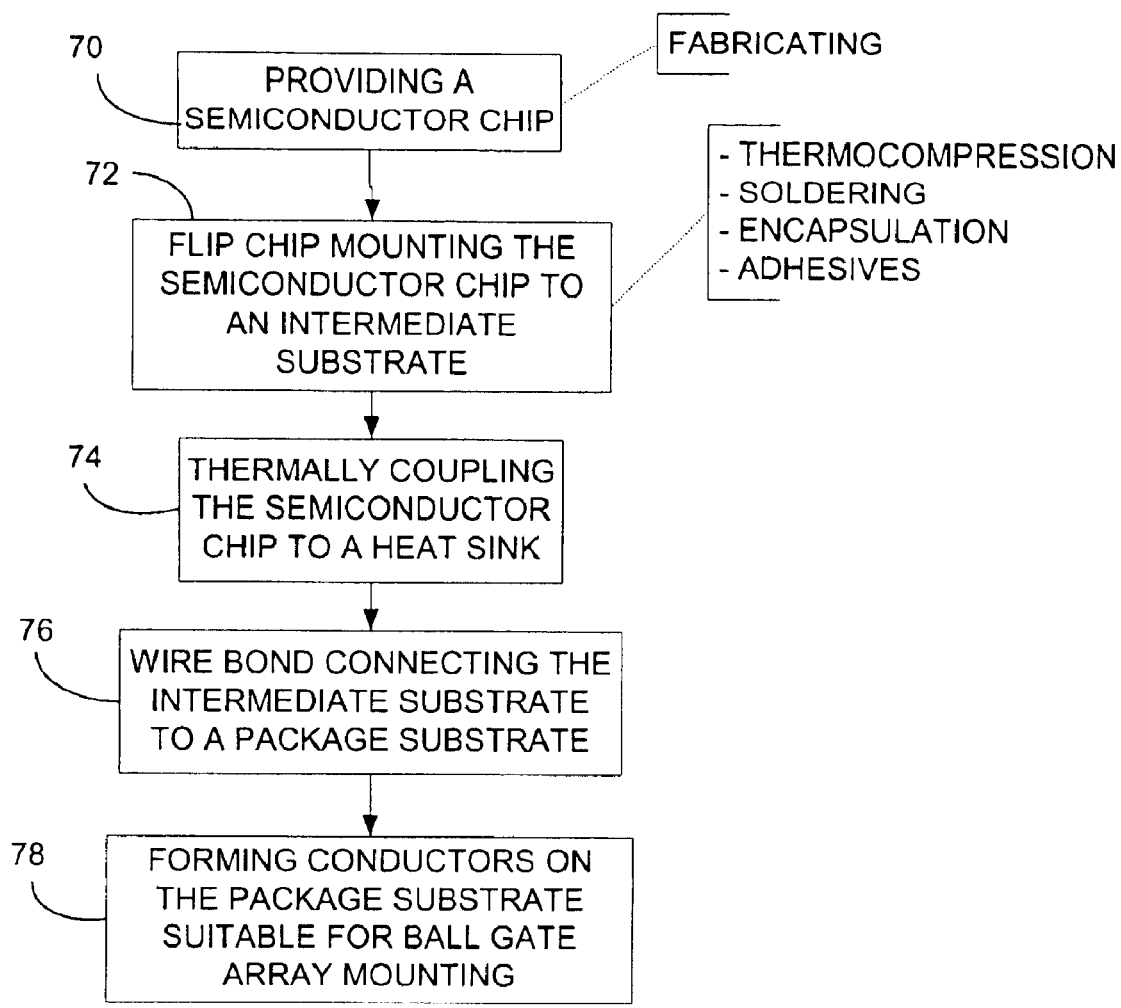
FIG. 5 shows a method of manufacturing an integrated chip package in accordance with the principles of the invention.

Shown in FIG. 5 is a method of manufacturing an integrated chip package 10 in accordance with the principles of the invention. At block 70 a semiconductor chip to be packaged is provided. The semiconductor chip is flip chip mounted to an intermediate substrate, block 72. The semiconductor chip is then thermally attached to a heat sink, block 74. At block 76, bonding wires are connected between the intermediate substrate and a package substrate. At block 78, conductors that are suitable for ball gate array mounting are formed on the package substrate.

A number of embodiments of the invention have been described. It is expressly intended that the foregoing description and accompanying drawings are illustrative of preferred embodiments only, not limiting, and that the true spirit and scope of the present invention will be determined by reference to the appended claims and their legal equivalent. It will be equally apparent and is contemplated that various modifications and/or changes may be made in the illustrated embodiments without departure from the spirit and scope of the invention. For example, the steps of the method of manufacturing may be performed in numerous different sequences. Accordingly, other embodiments are within the scope of the following claims.

What is claimed is:

1. An integrated chip package, comprising:
    at least one semiconductor chip having a firsts surface and a second surface;
    an intermediate substrate electrically coupled via conductive bumps to the first surface of the at least one semiconductor chip;
    a package substrate having a first surface electrically coupled to the intermediate substrate via a plurality of bonding wires; and
    a heat sink thermally coupled to the second surface of the semiconductor chip, wherein the intermediate substrate includes at least one capacitor electrically coupled to the at least one semiconductor chip, and
wherein the at least one capacitor comprises a trench capacitor.

2. The integrated chip package of claim 1 wherein the at least one capacitor is a trench capacitor having a dielectric selected from the group consisting of nitride oxide and oxide.

3. A method of forming an integrated chip package, comprising:
providing a semiconductor chip having a conductor pattern on a first surface;
electrically coupling the conductor pattern on the semiconductor chip to an intermediate substrate via a first set of conductive bumps;
thermally coupling a second side of the semiconductor chip to a heat sink; and
electrically coupling the intermediate substrate to a first surface of the package substrate via a plurality of bond wires; and
forming at least one capacitor in the intermediate substrate such that the at least one capacitor is electrically coupled to the at least one semiconductor chip,
wherein the at least one capacitor is a trench capacitor.

4. The integrated chip package of claim 1 wherein the intermediate substrate is a semiconductor substrate.

5. An integrated chip package, comprising:
at least one semiconductor chip having a first surface and a second surface;
an intermediate substrate electrically coupled via conductive bumps to the first surface of the at least one semiconductor chip;
a package substrate having a first surface electrically coupled to the intermediate substrate via a plurality of bonding wires; and
a heat sink thermally coupled to the second surface of the semiconductor chip,
wherein the intermediate substrate includes at least one capacitor electrically coupled to the at least one semiconductor chip,
wherein the at least one capacitor includes a first conductive plate formed on a first layer of the intermediate substrate, a dielectric formed on a second layer of the intermediate substrate, and a second conductive plate formed on a third layer of the intermediate substrate,
wherein at least one of the conductive bumps connects directly between the at least one semiconductor chip and the first conductive plate, and
at least another of the conductive bumps connects directly between the at least one semiconductor chip and the second conductive plate.

6. The integrated chip package of claim 1 wherein the second surface of the at least one semiconductor chip is adhesively bonded to the heat sink.

7. The integrated chip package of claim 1 wherein the heat sink is substantially thermally isolated from the package substrate.

8. The integrated chip package of claim 1 wherein the intermediate substrate is formed from a material selected from the group consisting of silicon, polysilicon, and glass.

9. The integrated chip package of claim 1 wherein the intermediate substrate includes a circuit plane selected from the group consisting of power planes, ground planes, and interconnect planes.

10. The integrated chip package of claim 1 further comprising a support material arranged between the package substrate and the intermediate substrate.

11. An integrated chip package, comprising:
at least one semiconductor chip having a first surface and a second surface;
a semiconductor substrate electrically coupled via conductive bumps to the first surface of the at least one semiconductor chip, the semiconductor substrate including at least one capacitor electrically coupled to the at least one semiconductor chip,
wherein the at least one capacitor comprises a trench capacitor;
a package substrate having a first surface electrically coupled to the semiconductor substrate via a plurality of bonding wires; and
a heat sink thermally coupled to the second surface the semiconductor chip.

12. The integrated chip package of claim 11 wherein the semiconductor substrate is a silicon substrate.

13. The integrated chip package of claim 11 wherein the semiconductor substrate is formed from a material selected from the group consisting of polysilicon and glass.

14. An integrated chip package, comprising:
at least one semiconductor chip having a first surface and a second surface;
an intermediate substrate electrically coupled via conductive bumps to the first surface of the at least one semiconductor chip, the intermediate substrate including at least one capacitor electrically coupled to the at least one semiconductor chip
wherein the at least one capacitor comprises a trench capacitor;
a planar package substrate having a first surface electrically coupled to the intermediate substrate via a plurality of bonding wires, the intermediate substrate arranged above and spaced apart from the planar package substrate; and
a heat sink having side portions extending towards the planar package surface, the heat sink thermally coupled to the second surface of the semiconductor chip so that heat generated from the at least one semiconductor chip flows towards the heat sink.

15. The method of claim 3 wherein the intermediate substrate is a semiconductor substrate.

16. A method of forming an integrated chip package, comprising the steps of:
providing a semiconductor chip having a conductor pattern on a first surface;
electrically coupling the conductor pattern on the semiconductor chip to an intermediate substrate via a first set of conductive bumps;
thermally coupling a second side of the semiconductor chip to a heat sink; and
electrically coupling the intermediate substrate to a first surface of the package substrate via a plurality of bond wires; and
forming at least one capacitor in the intermediate substrate such that the at least one capacitor is electrically coupled to the at least one semiconductor chip,
wherein the step of forming the at least one capacitor includes:
a) forming a first conductive plate on a first layer of the intermediate substrate;
b) forming a dielectric on a second layer of the intermediate substrate; and c) forming a second conductive plate on a third layer of the intermediate substrate; and further including the steps of directly connecting at least one of the conductive bumps between the at least one semiconductor chip and the first conductive plate; and directly connecting at least another of the conductive bumps between the at least one semiconductor chip, and the second conductive plate.

17. The method of claim 3 further including adhesively bonding the second side of the semiconductor chip to the heat sink.

18. The method of claim 3 further including thermally isolating the heat sink from the package substrate.

19. The method of claim 3 further including forming a circuit plane on the intermediate substrate,
wherein the circuit plane is selected from the group consisting of power planes, ground planes, and interconnect planes.

20. The method of claim 3 further including forming conductive pads on a second surface of the package substrate operable to electrically couple the integrated chip package to a circuit board via a second set of conductive bumps.

21. The method of claim 3 further comprising arranging a support material between the package substrate and the intermediate substrate.

22. A method of forming an integrated chip package, comprising:
providing a semiconductor chip having a conductor pattern on a first surface;
electrically coupling the conductor pattern on the semiconductor chip to a semiconductor substrate via a first set of conductive bumps;
thermally coupling a second side of the semiconductor chip to a heat sink so that heat generated from the semiconductor chip flows towards the heat sink;
electrically coupling the semiconductor substrate to a first surface of the package substrate via a plurality of bond wires; and
forming at least one capacitor in the semiconductor substrate such that the at least one capacitor is electrically coupled to the at least one semiconductor chip,
wherein the at least one capacitor comprises a trench capacitor.

23. The method of claim 22 wherein the semiconductor substrate is a silicon substrate.

24. The method of claim 22 further comprising forming the semiconductor substrate from a material selected from the group consisting of polysilicon and glass.

25. A method of forming an integrated chip package, comprising:
providing a semiconductor chip having a conductor pattern on a first surface;
electrically coupling the conductor pattern on the semiconductor chip to an intermediate substrate via a first set of conductive bumps;
providing a heat sink having side portions;
thermally coupling a second side of the semiconductor chip to the heat sink so that heat generated from the semiconductor chip flows towards the heat sink;
arranging a planar package substrate below and spaced apart from the intermediate substrate;
electrically coupling the intermediate substrate to a first surface of the planar package substrate via a plurality of bond wires; and forming at least one capacitor in the intermediate substrate such that the at least one capacitor is electrically coupled to the at least one semiconductor chip,
wherein the at least one capacitor comprises a trench capacitor.

26. An integrated chip package, comprising:
at least one semiconductor chip configured for flip chip mounting, having a first surface and a second surface;
a package substrate having a first surface and a second surface, the package substrate second surface to electrically couple the integrated chip package to a circuit board via conductive bumps;
a flip chip conversion means electrically coupled between the at least one semiconductor chip first surface and the package substrate first surface; and
a means for sinking heat from the second surface of the semiconductor chip,
wherein the flip chip conversion means includes at least one means for filtering electrical power electrically coupled to the at least one semiconductor chip, and
wherein the at least one means for filtering electrical power is a trench capacitor.

27. The integrated chip package of claim 26 wherein the flip chip conversion means is a semiconductor substrate.

28. An integrated chip package, comprising:
at least one semiconductor chip configured for flip chip mounting, having a first surface and a second surface;
a package substrate having a first surface and a second surface, the package substrate second surface to electrically couple the integrated chip package to a circuit board via conductive bumps;
a flip chip conversion means electrically coupled between the at least one semiconductor chip first surface and the package substrate first surface; and
a means for sinking heat from the second surface of the semiconductor chip,
wherein the flip chip conversion means includes at least one means for filtering electrical power electrically coupled to the at least one semiconductor chip,
wherein the at least one means for filtering electrical power includes:
a) a first conductive plate formed on a first layer of the intermediate substrate;
b) a dielectric formed on a second layer of the intermediate substrate; and
c) a second conductive plate formed on a third layer of the intermediate substrate; and
wherein at least one conductive bump connects directly between the at least one semiconductor chip and the first conductive plate; and
at least another conductive bump connects directly between the at least one semiconductor chip and the second conductive plate.

29. The integrated chip package of claim 26 further including means for adhesively bonding the second surface of the at least one semiconductor chip to the heat sinking means.

30. The integrated chip package of claim 26 further including means for thermally isolating the heat sinking means from the package substrate.

31. The integrated chip package of claim 26 wherein the flip chip conversion means is formed from a material selected from the group consisting of silicon, polysilicon, and glass.

32. An integrated chip package, comprising:
- at least one semiconductor chip configured for flip chip mounting, having a first surface and a second surface;
- a package substrate having a first surface and a second surface, the package substrate second surface to electrically couple the integrated chip package to a circuit board via conductive bumps;
- flip chip conversion means electrically coupled between the at least one semiconductor chip first surface and the planar package substrate first surface, the flip chip conversion means formed from a semiconductor material and including at least one means for filtering electrical power electrically coupled to the at least one semiconductor chip,
  - wherein the at least one means for filtering electrical power comprises a trench capacitor; and
- means for sinking heat from the second surface of the semiconductor chip so that heat generated from the semiconductor chip flows towards the means for sinking heat.

33. The integrated chip package of claim 32 wherein the flip chip conversion means is a silicon substrate.

34. The integrated chip package of claim 32 wherein the flip chip conversion means is formed from a material selected from the group consisting of polysilicon and glass.

35. An integrated chip package, comprising:
- at least one semiconductor chip configured for flip chip mounting, having a first surface and a second surface;
- a planar package substrate having a first surface and a second surface, the planar package substrate second surface to electrically couple the integrated chip package to a circuit board via conductive bumps;
- a flip chip conversion means arranged above and spaced apart from the planar package substrate first surface and electrically coupled between the at least one semiconductor chip first surface and the planar package substrate first surface;
- a means for sinking heat from the second surface of the semiconductor chip so that heat generated from the semiconductor chip flows towards the means for sinking heat, the means for sinking heat having side portions extending towards the planar package substrate,
  - wherein the flip chip conversion means includes at least one means for filtering electrical power electrically coupled to the at least one semiconductor chip, and
  - wherein at least one means for filtering electrical power comprises a trench capacitor.

36. The integrated chip package of claim 11, wherein the trench capacitor comprises a dielectric selected from the group consisting of nitride oxide and oxide.

37. The method of claim 22, wherein the trench capacitor comprises a dielectric selected from the group consisting of nitride oxide and oxide.

38. The integrated chip package of claim 32, wherein the trench capacitor comprises a dielectric selected from the group consisting of nitride oxide and oxide.

* * * * *